United States Patent
MacDonald et al.

(10) Patent No.: US 6,175,095 B1
(45) Date of Patent: Jan. 16, 2001

(54) RESONANT IMPEDANCE-MATCHING SLOW-WAVE RING STRUCTURE MICROWAVE APPLICATOR FOR PLASMAS

(75) Inventors: Niles K. MacDonald, Los Gatos, CA (US); Terry L. White, Knoxville, TN (US); James W. Caughran, Lodi, CA (US)

(73) Assignee: GaSonics International, San Jose, CA (US)

( * ) Notice: Under 35 U.S.C. 154(b), the term of this patent shall be extended for 0 days.

(21) Appl. No.: 09/272,690

(22) Filed: Mar. 18, 1999

(51) Int. Cl.$^7$ .................................................... B23K 9/00
(52) U.S. Cl. ............................. 219/121.43; 315/39
(58) Field of Search .................. 219/121.43, 121.48, 219/476; 315/478, 39, 39.3; 424/49; 118/723 MW, 723 R; 204/298.38

(56) References Cited

U.S. PATENT DOCUMENTS

| | | | |
|---|---|---|---|
| 3,646,388 | * 2/1972 | Dudley et al. | 315/3.5 |
| 3,814,983 | 6/1974 | Weissfloch | 315/39 |
| 5,284,544 | * 2/1994 | Mizutani et al. | 156/345 |
| 5,536,921 | * 7/1996 | Hedrick et al. | 219/693 |

\* cited by examiner

Primary Examiner—Joseph Pelham
Assistant Examiner—Quang Van
(74) Attorney, Agent, or Firm—Townsend and Townsend and Crew LLP

(57) ABSTRACT

A microwave applicator has exactly six equal length parallel rods equally distributed in 60° angular intervals in a circle, and at circumferential intervals that are one half the wavelength of operation of a microwave power source. The circumference is therefore preferred to be three wavelengths. The top ends of every rod terminate in a top planar shorting ring. The bottom ends of every rod terminate in a bottom planar shorting ring which is perpendicular to each of the rods and which is parallel to the top planar shorting ring. Intermediate to the two planar shorting rings are an upper and lower planar feed ring that are each parallel to the outside planar shorting rings. The upper planar feed ring connects to odd numbered rods and the lower planar feed ring connects to even numbered rods. A ridged tapered waveguide is connected to the feed rings at a point intersected by any one of the rods. A quartz, ceramic, or sapphire plasma tube is passed through the central axis of the planar shorting rings and feed rings. The applicator is tuned by either internal or external means to match its resonant frequency to that of the microwave source such that impedance mismatch reflections are minimized and the energy transferred to the plasma generated within the plasma tube is maximized.

8 Claims, 2 Drawing Sheets

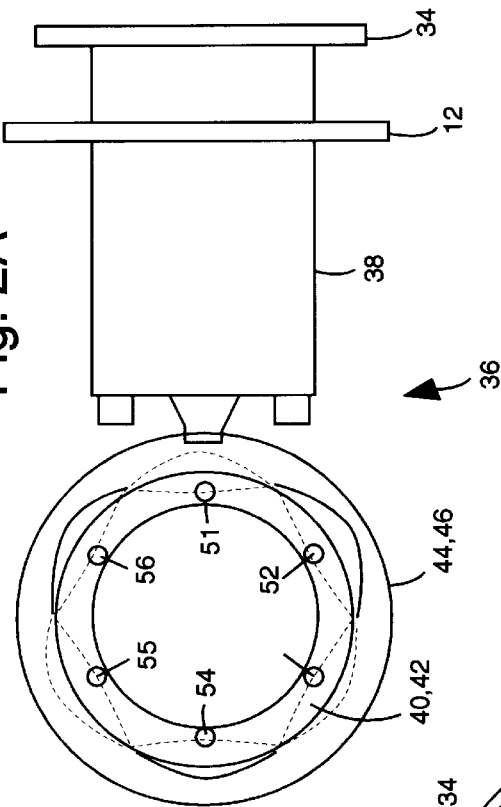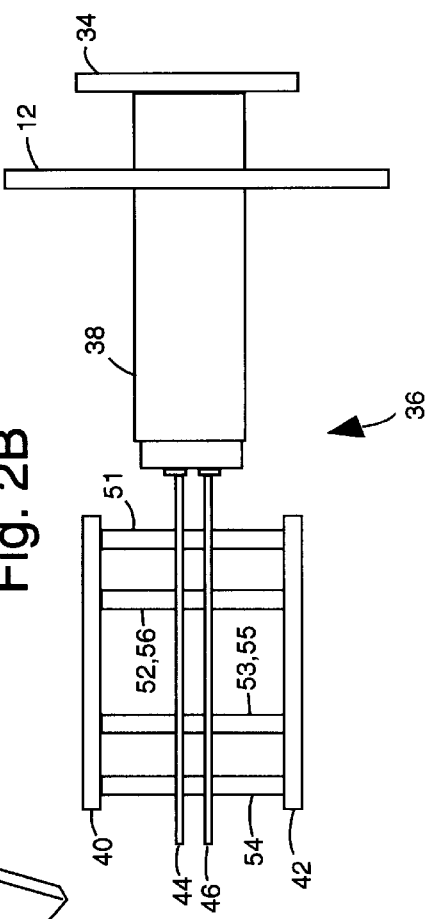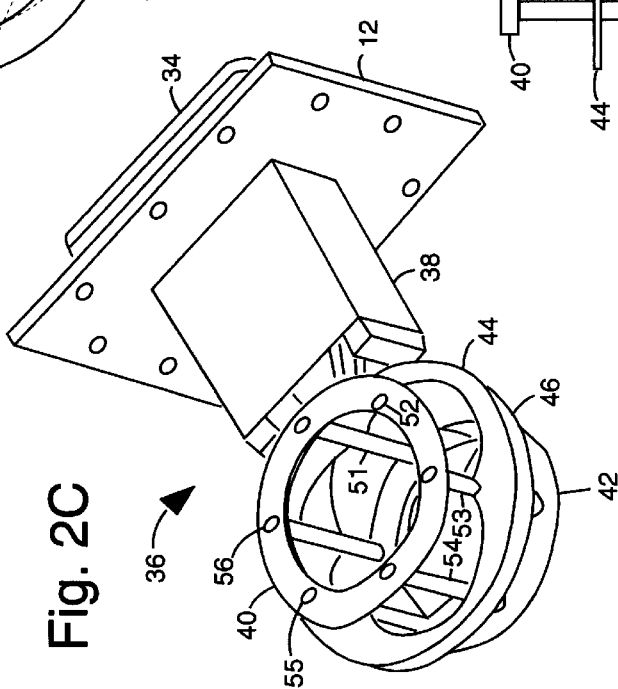

Figure 1:
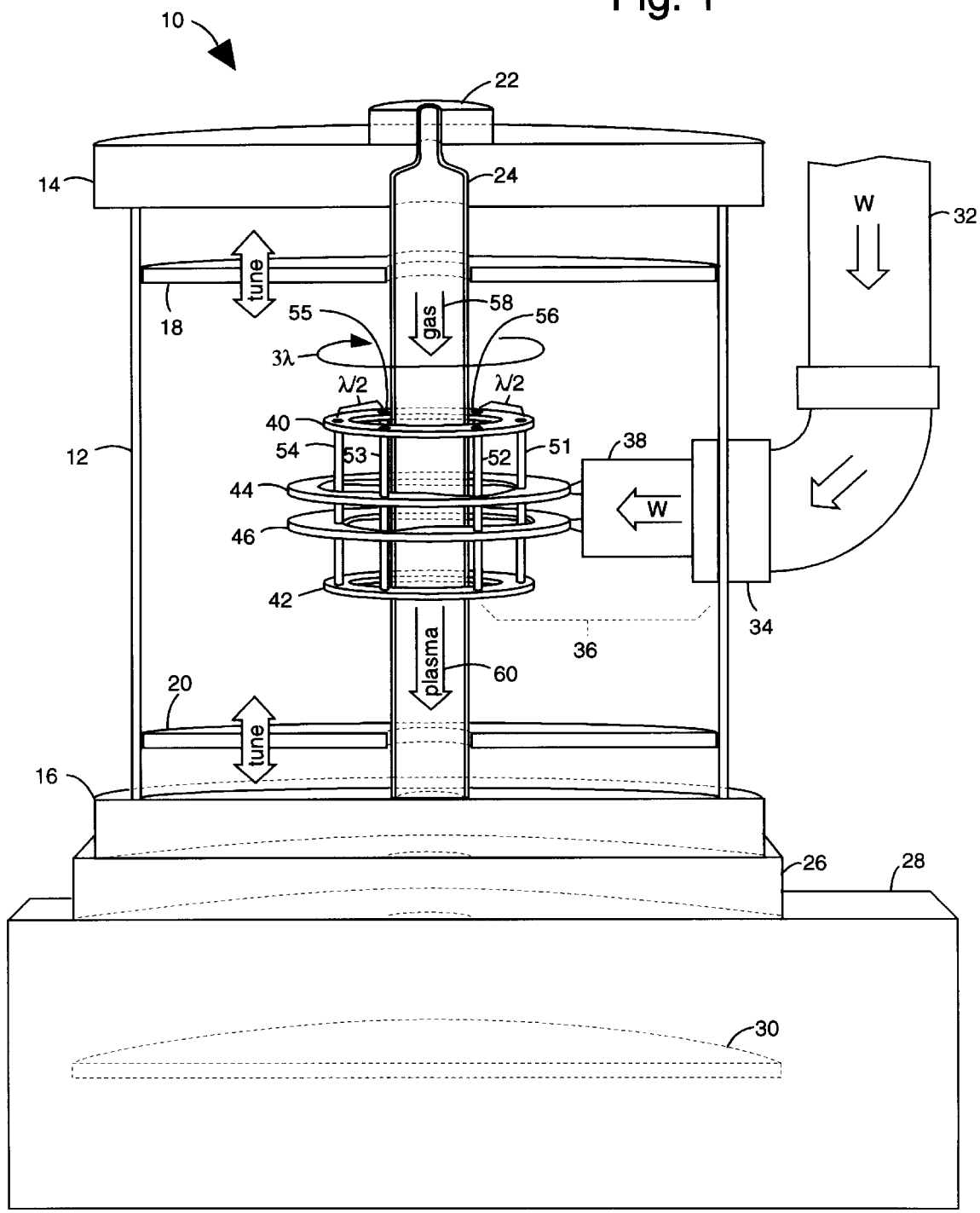

RESONANT IMPEDANCE-MATCHING SLOW-WAVE RING STRUCTURE MICROWAVE APPLICATOR FOR PLASMAS

BACKGROUND OF THE INVENTION

1. Field of the Invention

The present invention relates generally to semiconductor processing equipment and more particularly to plasma sources that can be operated at high powers for increased processing rates.

2. Description of the Prior Art

Microwave energy is conventionally coupled to gas flows to generate plasmas useful in semiconductor wafer processing. Prior art equipment couples as much as 1200 watts of microwave energy centered at 2.45 GHz from a ringed "applicator" through and into a quartz plasma tube that passes through the rings.

Carl F. Weissfloch, et al., describes one such applicator in U.S. Pat. No. 3,814,983, issued Jun. 4, 1974, and states that the use of microwave plasmas has been severely limited by the small size of plasma volumes achievable with conventional microwave applicators, namely antennas, waveguides, and cavity resonators. So a slow wave structure illustrated in FIGS. 6–8 of such patent is offered. A thirty-six inch long semi-radiant slow wave applicator is described that operates in the degenerate half wavelength ($\lambda/2$) mode. Slow wave structures such as microwave applicators are supposedly dividable into two types, resonant slow wave structures and traveling slow wave structures. A rectangular waveguide 2 transitions to the slow waveguide structure with a doubly tapered inner conductor 24 that connects to a tapered parallel plane transmission line 25. A set of twelve parallel bars 26, 31 are arranged in a fence-line in FIG. 6 and in a circle in FIGS. 7 and 8. Each bar 26, 31 terminates in a top shorting plane 29, 34 and at the opposite ends in a bottom shorting plane 29, 34. Some prior art equipment uses fourteen such bars in a circle. A central hole in each of the ring shorting planes 34 allows for the insertion of a plasma tube in which the microwave energy is delivered. In between the planes 29, 34, the odd numbered bars 26, 31 connect together with a strap 27, 32 and the even numbered bars 26, 31 connect together with a strap 28, 33. The transmission line 25 is connected to each of the straps 27, 32 and 28, 33 and enters perpendicular to the bars 26, 31.

In practice, such prior art structures have not worked very well. The power delivery is usually very uneven and concentrates near the first three sets of bars 31 in circular structures. The power delivered by the microwave system is usually limited to 1200 watts because spot heating of the quartz, sapphire or ceramic plasma tubes is too severe to be handled adequately by a cooling system. The terminating impedance presented to the waveguide and microwave source has not been good, and much of the power input is reflected back. The relatively close physical spacing of adjacent bars 26 and 31 on opposite phases carried by the straps 27, 28, 31 and 32 tend to arc together and pitting results.

SUMMARY OF THE PRESENT INVENTION

It is therefore an object of the present invention to provide a microwave energy plasma source that can increase semiconductor process production rates.

It is another object of the present invention to provide a higher power microwave energy plasma source than is conventionally possible.

It is a further object of the present invention to provide a microwave energy plasma source that produces a more uniform plasma.

It is another object of the present invention to provide a microwave energy plasma source that provides an efficient terminating impedance.

Briefly, a microwave applicator embodiment of the present invention comprises six, and only six, equal length parallel rods equally distributed in 60° angular intervals in a circle, and at circumferential intervals that are one half the wavelength of operation of a microwave power source. The circumference is therefore preferred to be three wavelengths. The top ends of every rod terminate in a top planar shorting ring. The bottom ends of every rod terminate in a bottom planar shorting ring which is perpendicular to each of the rods and which is parallel to the top planar shorting ring. Intermediate to the two planar shorting rings are upper and lower planar feed rings that are each parallel to the outside planar shorting rings. The upper planar feed ring connects to odd numbered rods and the lower planar feed ring connects to even numbered rods. A ridged waveguide is connected to feed the feed rings at a point centered where any one of the rods is located. A quartz, ceramic, or sapphire plasma tube is passed through the central axis of the planar shorting rings and feed rings. The applicator is tuned by either internal or external means to match its resonant frequency to that of the microwave source such that impedance mismatch reflections are minimized and the energy transferred to the plasma generated within the plasma tube is maximized.

An advantage of the present invention is a microwave energy plasma source is provided that can increase semiconductor wafer processing production rates.

Another advantage of the present invention is that a microwave energy plasma source is provided that can be operated at two to three times the plasma power levels of conventional equipment.

A further advantage of the present invention is that a microwave energy plasma source is provided that produces a more uniform plasma density within the plasma tube.

Another advantage of the present invention is that a microwave energy plasma source is provided that provides a better terminating impedance to connecting waveguides and microwave sources.

These and other objects and advantages of the present invention will no doubt become obvious to those of ordinary skill in the art after having read the following detailed description of the preferred embodiment which is illustrated in the drawing figures.

IN THE DRAWINGS

FIG. 1 is a cross sectional diagram of a microwave energy plasma source with a microwave applicator embodiment of the present invention, and the whole is mounted to a short coupled path extender and a semiconductor vacuum processing chamber; and FIGS. 2A, 2B, and 2C are top, side, and perspective views of the microwave applicator embodiment of the present invention shown in FIG. 1.

DETAILED DESCRIPTION OF THE PREFERRED EMBODIMENTS

FIG. 1 illustrates a microwave energy plasma source embodiment of the present invention, referred to herein by the general reference numeral 10. The microwave energy plasma source 10 comprises a metal cylinder 12 that has a top 14 and sits on a base 16. Such forms the basic microwave containment called a microwave cavity and the internal dimensions are preferably adjusted to resonance with the incoming microwave power. Typical systems use microwave energy centered on 2.45 GHz, which has a free-space wavelength of about 4.8". In alternative embodiments, the cylinder 12 includes a movable ceiling 18 and a movable floor 20 that are adjusted as tuning plates to fine tune the resonance of the cavity and thus the terminating impedance presented to the external microwave power source. A gas cap 22 allows a gas supply to be coupled into a plasma tube 24 made of quartz, sapphire, or ceramic. Which material is best is a function of the plasma source gas being used. Oxygen is a common plasma source gas used for etching. A short coupled path extender (SCPE) 26 connects the plasma produced into a semiconductor vacuum processing chamber. The SCPE 26 is preferably configured according to that described in U.S. patent application Ser. No. 08/788,602, filed Jan. 23, 1997. Such patent application is incorporated herein by reference. A wafer 30 being processed is shown inside the chamber 28 as an example of the use of the microwave energy plasma source 10.

Microwave energy from an external source is conventionally coupled in by a waveguide 32 that bolts to an adapter 34. Inside the cavity a microwave applicator 36 couples the received microwave energy to the plasma tube 24. A descriptive background on such applicators is provided by Carl F. Weissfloch, et al., describing one such applicator in U.S. Pat. No. 3,814,983, issued Jun. 4, 1974. Such patent is incorporated herein by reference. A tapered waveguide 38 is connected to a circular cage structure that surrounds the plasma tube 24. Such structure has four coaxial rings centered along the axis of the plasma tube 24. Plasma tubes with diameters of 1"–4" are typically accommodated.

A top shorting ring 40 and a bottom shorting ring 42 are parallel to one another. In alternative embodiments in may be advantageous to have the distance between rings 40 and 42 adjustable. A pair of feed rings 44 and 46 are located in between and receive opposite phases of microwave energy from the tapered waveguide 38. A set of six rods 51–56 are equally distributed at 60° intervals in a circle and connect at opposite ends to the top shorting ring 40 and the bottom shorting ring 42. The circumferential distance between adjacent rods 51–56 is critically required to be a distance about equal to half of the wavelength of the incoming microwave energy. For example, at 2.45 GHz, such interval would be about 2.4". Since there are six rods 51–56 set at half wavelength intervals, the circuit around each feed ring is three whole wavelengths. The first rod, rod 51, is critically positioned at a location that is bisected by the longitudinal centerline of the tapered waveguide 38. Rods 51, 53, and 55 connect to the upper feed ring 44. Rods 52, 54, and 56 connect to the lower feed ring 46.

During operation, a gas 58 is heated into a plasma 60 by the coupling of microwave energy into the gas from the waveguide 32 by the applicator 36. Operating power levels of three thousand watts have been realized for relatively long durations and without damage.

FIGS. 2A, 2B, and 2C show one way the applicator 36 was constructed. The shorting rings 40 and 42 are smaller in diameter than the feed rings 44 and 46. The outside diameters of the feed rings 44 and 46 are about the same and are circular. The inside diameters are wavy in order to clear the three rods 51–56 connected to by the other feed ring. In alternative embodiments, rods 51–56 are made to be telescoping in order to provide a fine tuning capability for the applicator 36. The microwave cavity defined by the cylinder 12 and the tuning plates 18 and 20, and the applicator 36, are preferably operated at their resonant frequency. But since typical microwave sources deliver only a fixed frequency of 2.45 GHz, the resonant frequency of the assembly is mechanically and thus electrically tuned to resonance. At such resonance, the terminating impedance vector is at zero degrees, e.g., have neither inductive nor capacitive reactances, and the bulk of the energy is transferred into the resistive load presented by converting the gas 58 to the plasma 60.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A microwave applicator for generating gas plasmas from microwave energy, comprising:

an even number of equal-length parallel rods equally distributed at regular angular intervals in a circle;

a top planar shorting ring perpendicularly connected to a top end of each and every one of the rods;

a bottom planar shorting ring perpendicularly connected to a bottom end of each and every one of the rods; and an upper and a lower planar feed ring that are each parallel to and positioned between the top and bottom planar shorting rings;

wherein, the upper planar feed ring connects to odd numbered rods and the lower planar feed ring connects to even numbered rods; and wherein, the equal-length parallel rods are positioned such that adjacent rods are separated by about one half of the wavelength of operation of a microwave power source;

wherein: the planar shorting rings and planar feed rings are each provided with a coaxial hole to accommodate a gas plasma tube; and wherein: each of the rods includes telescoping means for adjusting the distance between the top and bottom planar shorting rings and provides for matching a resonant frequency of the applicator to an operating frequency of said microwave power source such that any impedance mismatch reflections can be minimized and any energy transferred to a plasma generated within said gas plasma tube can be maximized.

2. The applicator of claim 1, further comprising:

a tapered waveguide connected to feed opposite phases of microwave energy from said microwave power source to the upper and lower feed rings at a radial position intersected by any one of the rods.

3. The applicator of claim 1, further comprising:

tuning means for matching a resonant frequency of the applicator to an operating frequency of said microwave power source such that any impedance mismatch reflections can be minimized and any energy transferred to a plasma generated within said gas plasma tube can be maximized.

4. The applicator of claim 1, wherein: the upper planar feed ring connects to even numbered rods and the lower planar feed ring connects to odd numbered rods.

5. A microwave applicator for generating gas plasmas from microwave energy, comprising:

- a set of six equal-length parallel rods equally distributed at regular angular intervals of 60° in a circle;
- a top planar shorting ring perpendicularly connected to a top end of each and every one of the rods;
- a bottom planar shorting ring perpendicularly connected to a bottom end of each and every one of the rods;
- an upper and a lower planar feed ring that are each parallel to and positioned between the top and bottom planar shorting rings;
- telescoping means included in each of the rods that provides for adjusting the electrical distance between the top and bottom planar shorting rings and that provides for matching a resonant frequency of the applicator to an operating frequency of said microwave power source such that any impedance mismatch reflections can be minimized and any energy transferred to a plasma generated within said gas plasma tube can be maximized; and
- a tapered waveguide connected to feed opposite phases of microwave energy from said microwave power source to the upper and lower feed rings at a radial position intersected by any one of the rods;
- wherein, the planar shorting rings and planar feed rings are each provided with a coaxial hole to accommodate a gas plasma tube;
- wherein, the upper planar feed ring connects to odd numbered rods and the lower planar feed ring connects to even numbered rods; and
- wherein, the equal-length parallel rods are positioned such that adjacent rods are separated by about one half of the wavelength of operation of a microwave power source.

6. The applicator of claim 5, wherein: the upper planar feed ring connects to even numbered rods and the lower planar feed ring connects to odd numbered rods.

7. A microwave applicator for generating gas plasmas from microwave energy, comprising:

- an even number of equal-length parallel rods equally distributed at regular angular intervals in a circle;
- a top planar shorting ring perpendicularly connected to a top end of each and every one of the rods;
- a bottom planar shorting ring perpendicularly connected to a bottom end of each and every one of the rods; and
- an upper and a lower planar feed ring that are each parallel to and positioned between the top and bottom planar shorting rings;
- wherein, the upper planar feed ring connects to odd numbered rods and the lower planar feed ring connects to even numbered rods;
- wherein, the equal-length parallel rods are positioned such that adjacent rods are separated by about one half of the wavelength of operation of a microwave power source;
- wherein: the planar shorting rings and planar feed rings are each provided with a coaxial hole to accommodate a gas plasma tube;
- wherein: each of the rods includes telescoping means for adjusting the distance between the top and bottom planar shorting rings and provides for matching a resonant frequency of the applicator to an operating frequency of said microwave power source such that any impedance mismatch reflections can be minimized and any energy transferred to a plasma generated within said gas plasma tube can be maximized; and
- wherein: the rods are exactly six in number and are distributed in said circle at angular intervals of 60°, and the 360° circumferential distance around the planar feed rings is approximately three wavelengths at an operating frequency of said microwave power source.

8. The microwave applicator of claim 7, wherein: the upper planar feed ring connects to even numbered rods and the lower planar feed ring connects to odd numbered rods.

* * * * *